(12) United States Patent
Barton et al.

(10) Patent No.: US 7,884,485 B1
(45) Date of Patent: Feb. 8, 2011

(54) SEMICONDUCTOR DEVICE INTERCONNECT SYSTEMS AND METHODS

(75) Inventors: Jeffrey B. Barton, Goleta, CA (US); Diane M. Salazar, Santa Barbara, CA (US); Joseph H. Durham, Santa Barbara, CA (US)

(73) Assignee: Flir Systems, Inc., Wilsonville, OR (US)

( * ) Notice: Subject to any disclaimer, the term of this patent is extended or adjusted under 35 U.S.C. 154(b) by 0 days.

(21) Appl. No.: 11/674,733

(22) Filed: Feb. 14, 2007

(51) Int. Cl.
*H01L 23/48* (2006.01)
*H01L 21/00* (2006.01)

(52) U.S. Cl. .......... 257/777; 257/E23.01; 257/E21.506; 438/109

(58) Field of Classification Search .......... 257/734–741, 257/749, 779–783, 785, 786, E23.001, E23.019, 257/E23.021, E21.001, E21.002, E21.04, 257/E21.499, E21.506; 438/584, 597–599, 438/612–617, 106–109
See application file for complete search history.

(56) References Cited

U.S. PATENT DOCUMENTS

| | | | |
|---|---|---|---|
| 5,110,299 A | 5/1992 | Gates | |
| 5,878,942 A * | 3/1999 | Kodama et al. | 228/180.22 |
| 6,310,400 B1 * | 10/2001 | Doyle et al. | 257/777 |
| 6,396,155 B1 * | 5/2002 | Nukiwa et al. | 257/778 |
| 6,550,665 B1 * | 4/2003 | Parrish et al. | 228/180.22 |
| 6,605,524 B1 * | 8/2003 | Fan et al. | 438/613 |
| 6,864,116 B1 * | 3/2005 | Kim et al. | 438/65 |
| 2003/0160172 A1 * | 8/2003 | Ashokan et al. | 250/338.4 |
| 2004/0104484 A1 * | 6/2004 | Chen et al. | 257/772 |
| 2005/0104219 A1 * | 5/2005 | Matsui | 257/774 |

\* cited by examiner

*Primary Examiner*—Sue Purvis
*Assistant Examiner*—Kevin Quinto
(74) *Attorney, Agent, or Firm*—Haynes and Boone, LLP

(57) ABSTRACT

Systems and methods are disclosed for forming interconnects between semiconductor devices in accordance with one or more embodiments of the present invention. For example, a method of forming interconnects between semiconductor devices includes depositing a plurality of first contacts on a plurality of corresponding first pads of a first semiconductor device; forming a plurality of plated contacts on a plurality of corresponding second pads of a second semiconductor device; aligning the plurality of first contacts with the plurality of plated contacts; and joining the plurality of first contacts to the plurality of plated contacts to form the interconnects between the first semiconductor device and the second semiconductor device.

20 Claims, 6 Drawing Sheets

US 7,884,485 B1

SEMICONDUCTOR DEVICE INTERCONNECT SYSTEMS AND METHODS

TECHNICAL FIELD

The present invention relates generally to electrical circuits and semiconductor processing and, more particularly for example, to techniques for forming interconnects between semiconductor devices.

BACKGROUND

For certain types of semiconductor device fabrication, it may be desirable to mate one semiconductor device to another. The mated semiconductor devices may be of the same material or different materials, and are mated to physically attach the devices to each other and/or to provide a large number of electrical interconnects between the mated semiconductor devices (e.g., to allow electrical conduction of signals between the semiconductor devices).

For example, modern state-of-the-art infrared components may use this type of interconnect technology, with one semiconductor device material optimized to perform a detection function (e.g., infrared detector) and the other semiconductor device material optimized to perform detector biasing, signal integration, signal processing, and/or multiplexing functions (e.g., read-out integrated circuit (ROIC)). The interconnect array for these devices physically and electrically interconnects the infrared detector to the ROIC, with the interconnect array typically forming thousands to millions of electrical interconnects.

In a typical approach, metallic contacts (also referred to as bumps) are formed on pads (contact pads) of each semiconductor device (e.g., substrate) to be electrically connected, and then the semiconductor devices with their respective interconnect contact arrays are precisely aligned to one another. The contacts may be attached to each other using elevated temperatures to melt the contacts into each other and/or using elevated pressures to force solid contacts to bond (e.g., in a process known as a "cold weld"). A drawback of this conventional approach is that the devices must be very precisely aligned to provide proper mating for all of the corresponding contacts in the contact arrays, with the very precise alignment maintained during the thermal exposure cycle (e.g., to prevent the contacts from cross-wetting the adjacent contacts). Furthermore, if the mating substrate materials have dissimilar coefficients of thermal expansion, stresses introduced into the mating contacts as the device cools can also lead to substrate damage and device failure.

As a result, there is a need for improved techniques for forming interconnects between semiconductor devices.

SUMMARY

Systems and methods are disclosed for joining semiconductor devices in accordance with one or more embodiments of the present invention. For example in accordance with an embodiment, techniques are disclosed for forming contact arrays on two semiconductor devices, with a first semiconductor device having an array of deposited contacts and the second semiconductor device having an array of plated contacts. The resulting semiconductor device, formed by mating the deposited contacts of the first semiconductor device to the plated contacts of the second semiconductor, may provide certain advantages over conventional approaches in terms of alignment tolerances and lower failure rates for contact mating.

More specifically, in accordance with one embodiment of the present invention, a method of forming interconnects between semiconductor devices includes depositing a plurality of first contacts on a plurality of corresponding first pads of a first semiconductor device; forming a plurality of plated contacts on a plurality of corresponding second pads of a second semiconductor device; aligning the plurality of first contacts with the plurality of plated contacts; and joining the plurality of first contacts to the plurality of plated contacts to form the interconnects between the first semiconductor device and the second semiconductor device.

In accordance with another embodiment of the present invention, a semiconductor device includes a first substrate having a plurality of first contacts on corresponding first pads, wherein the first contacts have a substantially flat surface area; a second substrate having a plurality of second contacts on corresponding second pads, wherein the second contacts are plated and form pillar-like projections; and wherein the first contacts are in contact with corresponding ones of the second contacts to electrically couple the first substrate to the second substrate of the semiconductor device.

In accordance with another embodiment of the present invention, a method of joining a first substrate to a second substrate includes forming by deposition a plurality of first contacts on the first substrate, wherein the first contacts provide a substantially flat area; forming by plating a plurality of second contacts on the second substrate, wherein the second contacts provide pillar-like projections; aligning the plurality of first contacts with the plurality of second contacts; and forming electrical interconnects between the first and second substrates through the first and second contacts.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

FIGS. 1a-1d show side-view diagrams illustrating processing operations for a semiconductor device 100 in accordance with an embodiment of the present invention. Semiconductor device 100 may represent, for example, a semiconductor chip (e.g., an ROIC made from silicon or germanium), a circuit board (e.g., made from ceramics or metalized ceramics), or an infrared (IR) detector (e.g., made from InSb, HgCdTe, CdTe, InGaAs, ceramics, or glasses).

Semiconductor device 100, which for this specific example may represent a ROIC, includes a silicon substrate 110 and pads 120. Silicon substrate 110 (FIG. 1a) generally includes one or more processed semiconductor layers (e.g., standard silicon CMOS technology providing layers that may include, for example, circuit elements, metal layers, and/or interconnect layers). Pads 120 are formed on substrate 110 in a conventional manner and represent contact pads, which may be made from suitable metals (e.g., aluminum, nickel, or gold) and optionally may include one or more additional layers of conductive materials such as for example chromium or titanium adhesion layers, nickel or nitride diffusion barrier layers, oxide layers, and/or other types of layers.

Figure 1A:
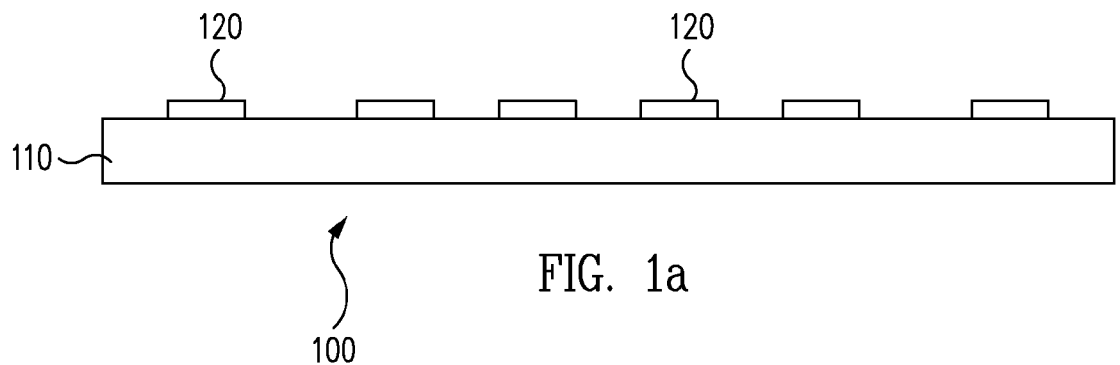
FIGS. 1a-1d show side-view diagrams illustrating processing operations for a semiconductor device in accordance with an embodiment of the present invention.
Figure 1B:
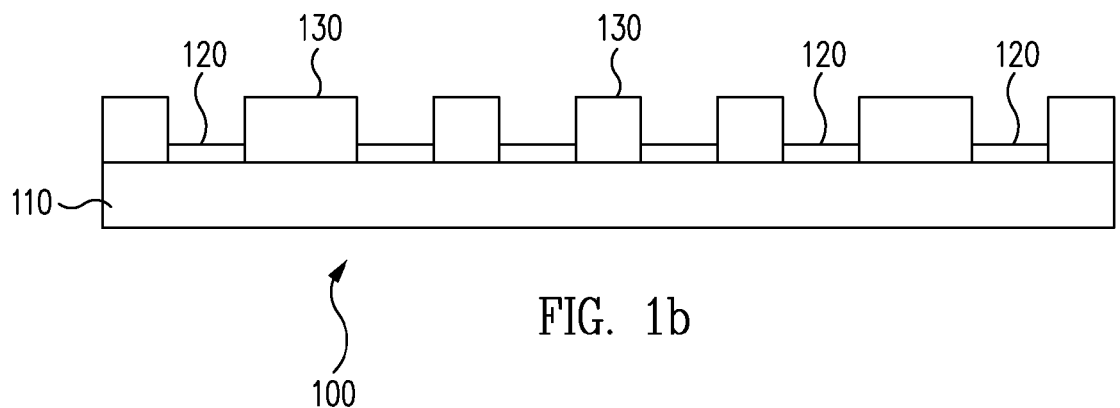
Figure 1C:
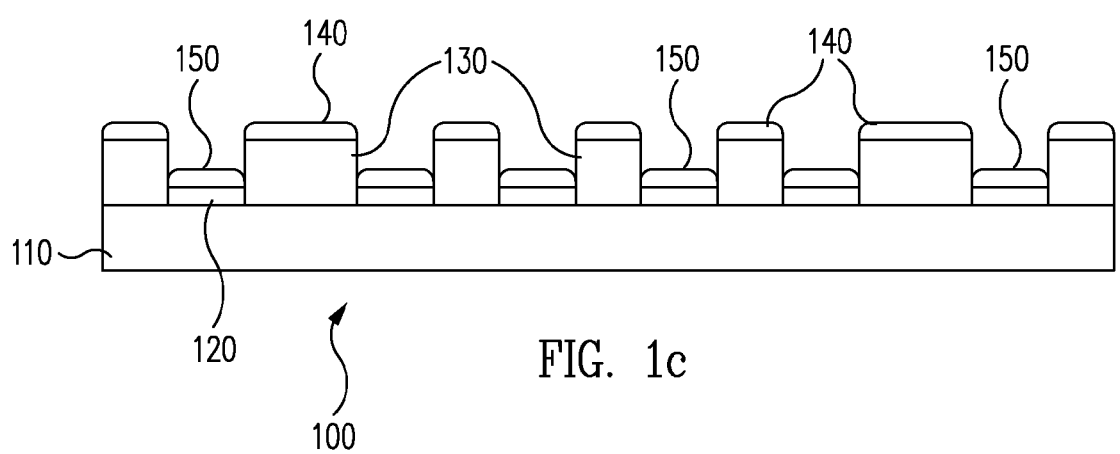
Figure 1D:
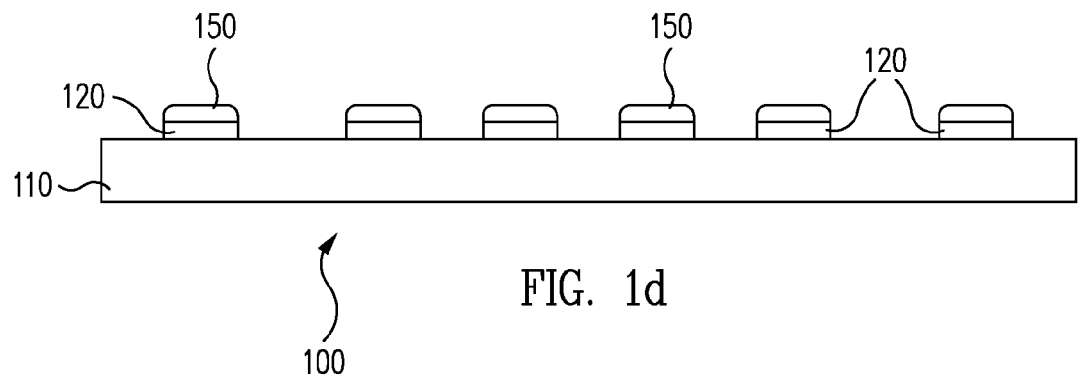

Substrate 110 is then coated with a photoresist 130, which is patterned as shown in FIG. 1b. A contact material (e.g., indium) is then deposited to form deposits 140 and contacts 150 on photoresist 130 and pads 120, respectively, as shown in FIG. 1c using conventional deposition techniques, such as for example sputtering, evaporation, electrodeposition, and electroless deposition. As an example, the volume of each contact 150 may be controlled by the thickness (or height) of the indium material deposited onto pads 120 using conventional techniques to provide a suitable surface for contact with a corresponding contact on a semiconductor device to be joined to semiconductor device 100, as discussed further herein (e.g., in reference to FIG. 3). Photoresist 130 along with deposits 140 are then removed, as shown in FIG. 1d, in a conventional fashion (e.g., lift-off process), leaving pads 120 and contacts 150 on substrate 110 of semiconductor device 100.

It should be understood that one or more contacts 150 may also be formed directly onto substrate 110, rather than on pads 120. This may be done for example in accordance with an embodiment to provide mechanical support (without necessarily forming an electrical path) between semiconductor device 100 and another semiconductor device (e.g., semiconductor device 200 discussed further herein) joined to semiconductor device 100.

FIGS. 2a-2e show side-view diagrams illustrating processing operations for a semiconductor device 200 in accordance with an embodiment of the present invention. Semiconductor device 200 may represent, for example as discussed similarly for semiconductor device 100, a semiconductor chip (e.g., an ROIC made from silicon or germanium), a circuit board (e.g., made from ceramics or metalized ceramics), or an infrared (IR) detector (e.g., made from InSb, HgCdTe, CdTe, InGaAs, ceramics, or glasses).

Semiconductor device 200, which for this specific example may represent an IR detector, includes a substrate 210 and pads 220. Substrate 210, which for example is made from InSb or InGaAs material and conductive at room temperature, may include one or more processed semiconductor layers to provide in a conventional fashion an array of IR-sensitive devices (e.g., microbolometers). Pads 220 are formed on substrate 210 in a conventional manner and represent contact pads, which may be made from suitable metals (e.g., aluminum, nickel, or gold) and optionally may include one or more additional layers of conductive materials such as for example chromium or titanium adhesion layers, nickel or nitride diffusion barrier layers, oxide layers, and/or other types of layers, as discussed similarly for pads 120 (FIG. 1a).

Figure 2A:
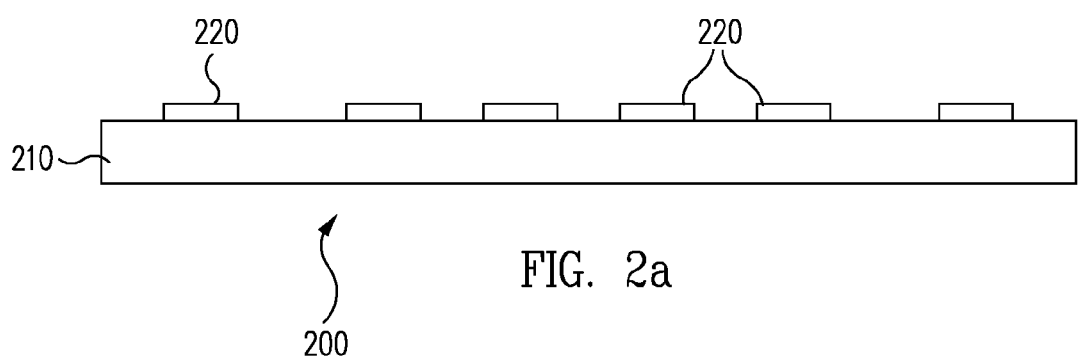
FIGS. 2a-2e show side-view diagrams illustrating processing operations for a semiconductor device in accordance with an embodiment of the present invention.
Figure 2B:
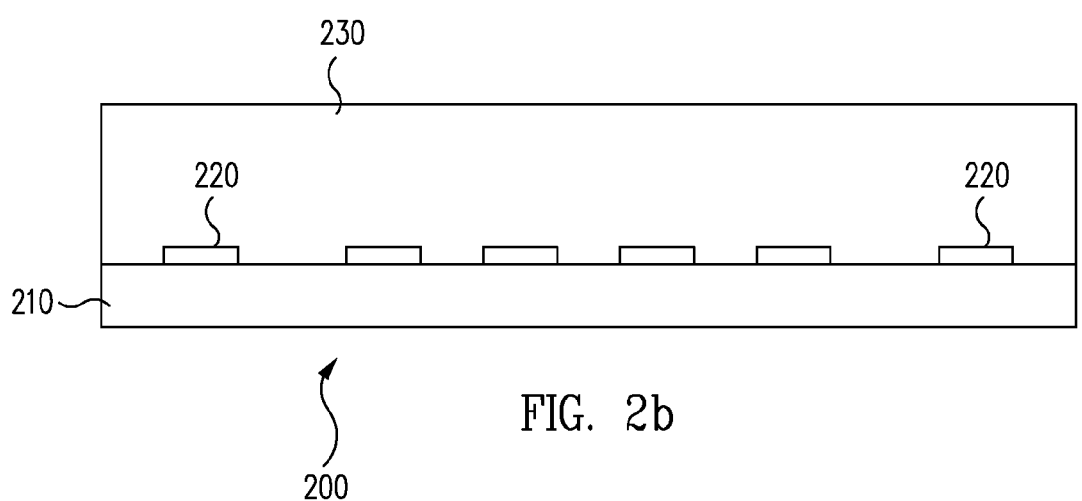
Figure 2C:
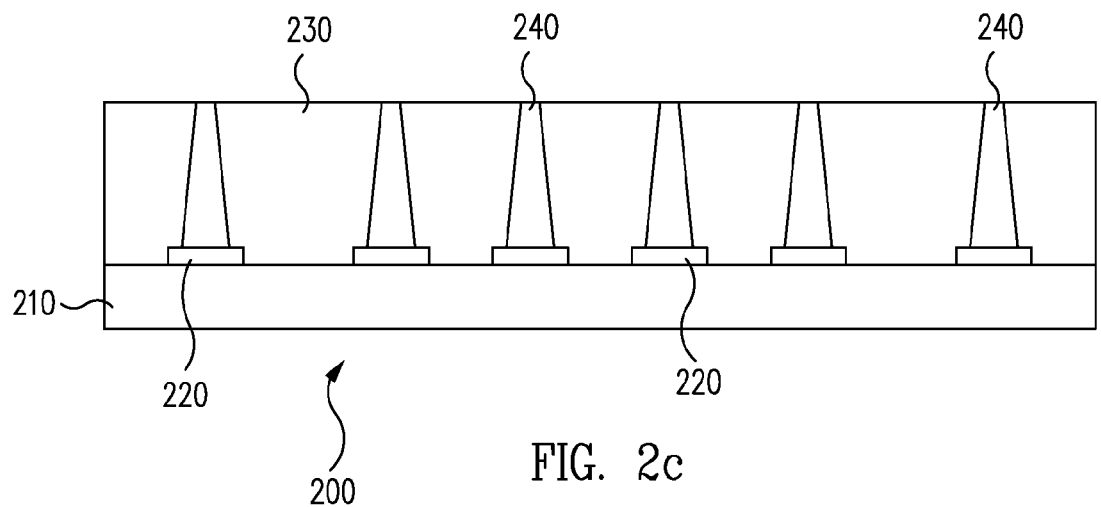
Figure 2D:
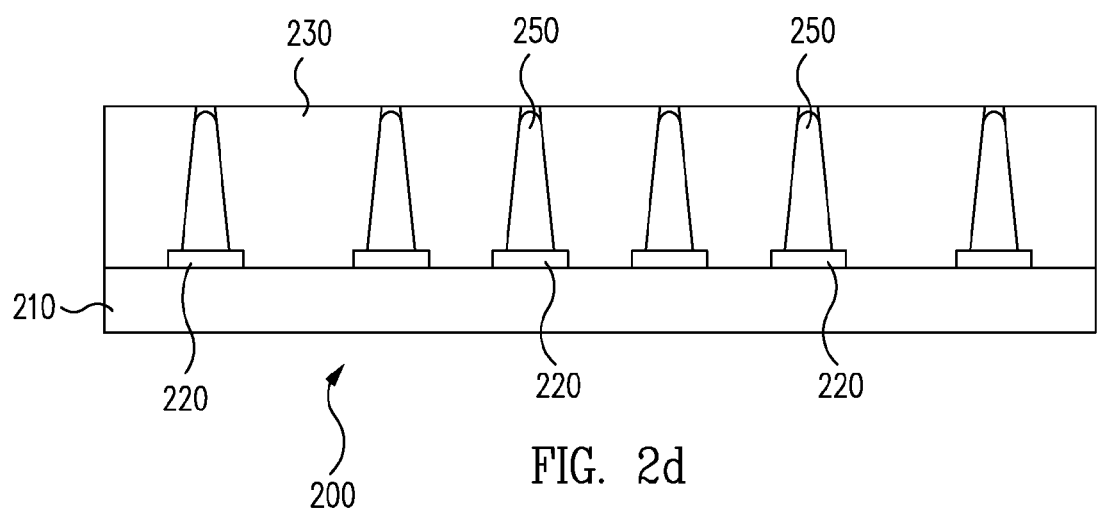

Substrate 210 is then coated with a photoresist 230, as shown in FIG. 2b, which may be patterned, developed, and then partially removed to form regions 240 over pads 220 as would be understood by one skilled in the art, as shown in FIG. 2c. A plating process is then performed on semiconductor device 200 to form plated contacts 250 on pads 220 in regions 240 (as shown in FIG. 2d).

It should be understood that one or more contacts 250 may also be formed directly onto substrate 210, rather than on pads 220. This may be done for example in accordance with an embodiment to provide mechanical support (without necessarily forming an electrical path) between semiconductor device 200 and another semiconductor device (e.g., semiconductor device 100 discussed further herein) joined to semiconductor device 200.

The plating process may be performed, for example, by applying a metal contact (e.g., a spring) to substrate 210 and providing a current through the metal contact during the plating process to form contacts 250 (e.g., made of indium), as would be understood by one skilled in the art. As an example, photoresist 230 may represent a single-layer photoresist (e.g., SPR-220-7.0 high-resolution resist of 12 micrometers in height), while contacts 250 may be formed of plated indium (e.g., 6-10 micrometers in height).

Figure 2E:
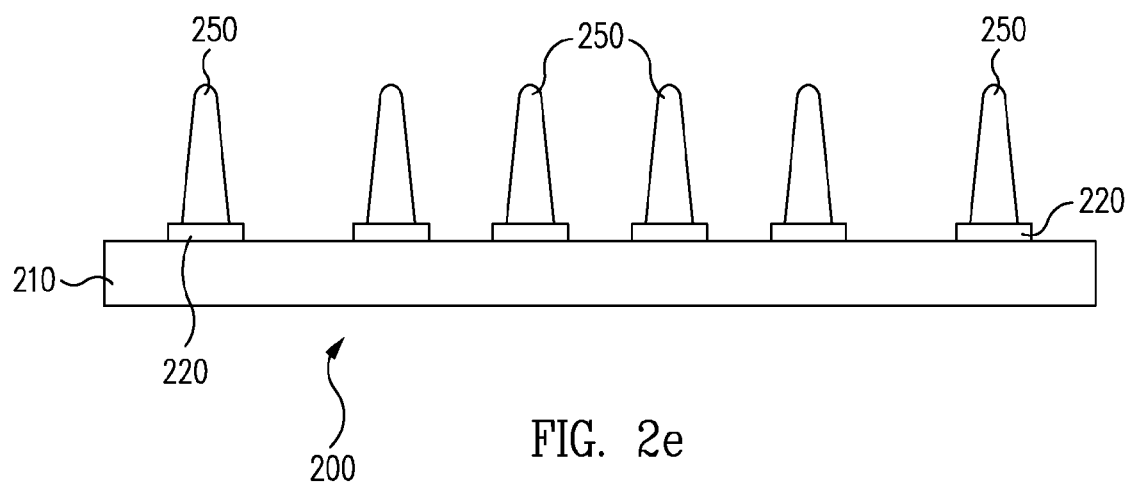

Photoresist 230 is then removed, as shown in FIG. 2e, leaving contacts 250 on pads 220 of substrate 210. Contacts 250 form finger-like projections (e.g., tapered pillars) extending from semiconductor device 200 and may be used to form a physical and/or electrical connection with corresponding contacts on another semiconductor device in accordance with one or more embodiments of the present invention.

Figure 3:
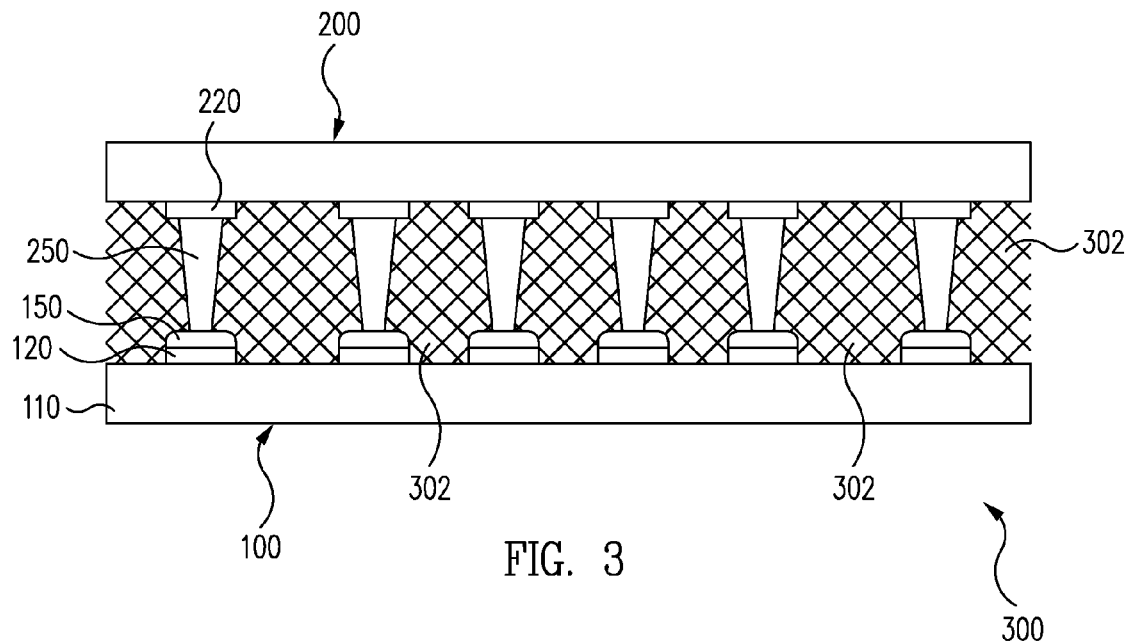
FIG. 3 shows a side-view diagram illustrating the semiconductor device formed from processing operations of FIGS. 1a-1d joined to the semiconductor device formed from processing operations of FIGS. 2a-2e in accordance with an embodiment of the present invention.

For example, FIG. 3 shows a side-view diagram of a device 300 illustrating semiconductor device 100 formed from processing operations of FIGS. 1a-1d joined to semiconductor device 200 formed from processing operations of FIGS. 2a-2e in accordance with an embodiment of the present invention. Device 300 for example may represent an IR sensor device, with semiconductor device 200 representing an IR detector and semiconductor device 100 representing a ROIC. Semiconductor device 100 may be aligned with and joined to semiconductor device 200 using conventional techniques as would be understood by one skilled in the art.

As a specific example, contacts 250 and contacts 150 are both made of indium and formed from a plating process and a deposition process, respectively, as discussed herein in accordance with one or more embodiments of the present invention. Contacts 150 formed from deposited indium is generally softer (e.g., softer crystal formations) than contacts 250 formed from plated indium (e.g., harder single or poly crystal formations). Consequently, when semiconductor device 100 is aligned and mated to semiconductor device 200, contacts 250, which are hard finger-like projections (e.g., hard, tapered pillars), tend to join with (e.g., dent) and form a good contact with contacts 150, which are softer and have a flatter, wider surface well suited for receiving contacts 250. Furthermore, contacts 250 may absorb some thermal expansion coefficient stresses and/or other stresses and strains due to material differences between semiconductor device 100 and semiconductor device 200.

Figure 6A:
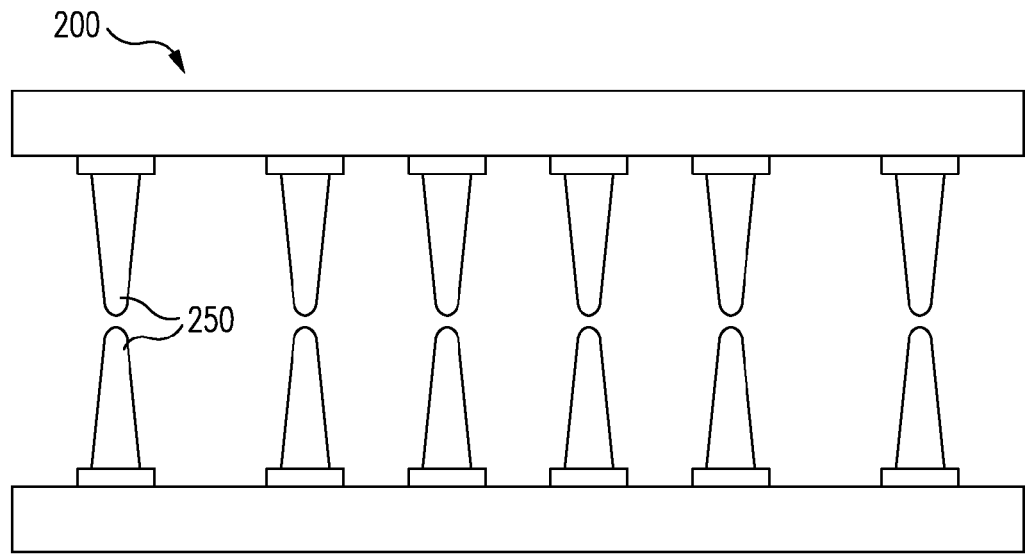
FIGS. 6a-6b show side-view diagrams illustrating a potential drawback of joining two semiconductor devices formed from processing operations of FIGS. 2a-2e.
Figure 6B:
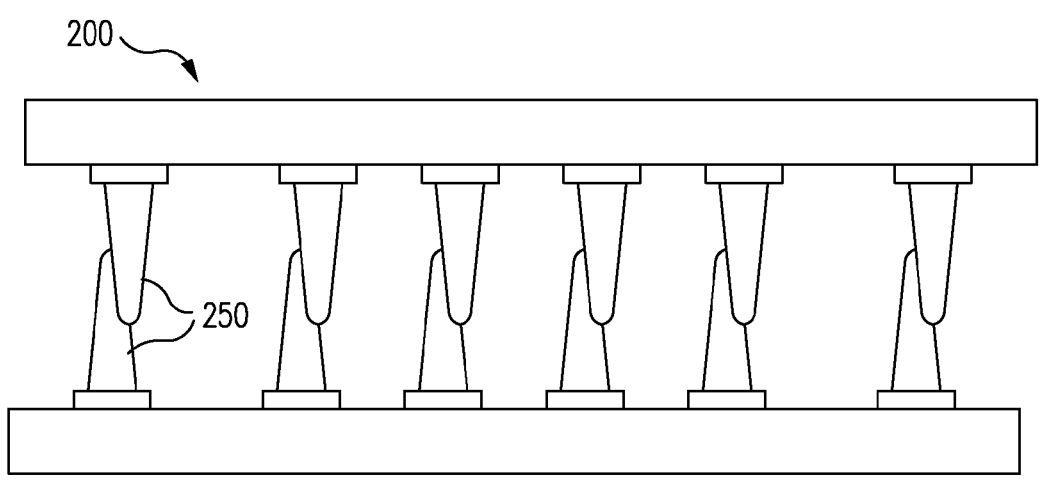

Thus, the techniques disclosed herein may offer certain advantages over alternative approaches. For example, referring briefly to FIGS. 6a and 6b, side-view diagrams of a device 600 illustrates a potential drawback of joining two semiconductor devices 200 formed from processing operations of FIGS. 2a-2e. As illustrated in FIG. 6a, the alignment process may need to be much more accurate as the surface area of opposing contacts 250 may be much less relative to opposing contacts 150 and 250. Furthermore, as illustrated in FIG. 6b, any misalignment may result in opposing contacts 250 failing to directly contact at the endpoints and instead forming a less preferable side-contact region, which may result in excessive strain, potential device failure, and poor physical and/or electrical connectivity.

Returning to FIG. 3, an epoxy or other adhesive material 302 may be wicked into interstices between contacts 150 and contacts 250 (e.g., in the area between interconnects formed by opposing contacts 150 and 250) in accordance with an embodiment of the present invention. Adhesive material 302 may serve to mechanically stabilize and physically connect semiconductor devices 100 and 200.

In general, semiconductor device 100 and semiconductor device 200 may represent any type of substrates that are to be physically and/or electrically connected. The techniques disclosed herein may allow substantially larger and denser arrays of contacts (i.e., bump arrays) to be used to connect the substrates and/or may provide lower contact connection failure rates.

As an example as disclosed herein, an IR detector array (e.g., semiconductor device 200) is mated to a ROIC (e.g., semiconductor device 100) to form an IR sensor device as would be understood by one skilled in the art. In general, the plating process may be performed more effectively with substrates that provide good electrical paths between the pads. For example, the indium plating process to form contacts 250 may be better suited for the IR detector (e.g., semiconductor device 200) than for the ROIC (e.g., semiconductor device 100) as substrate 210 may provide a better conductive path to pads 220 than could be provided by substrate 110 to pads 120.

Figure 4:
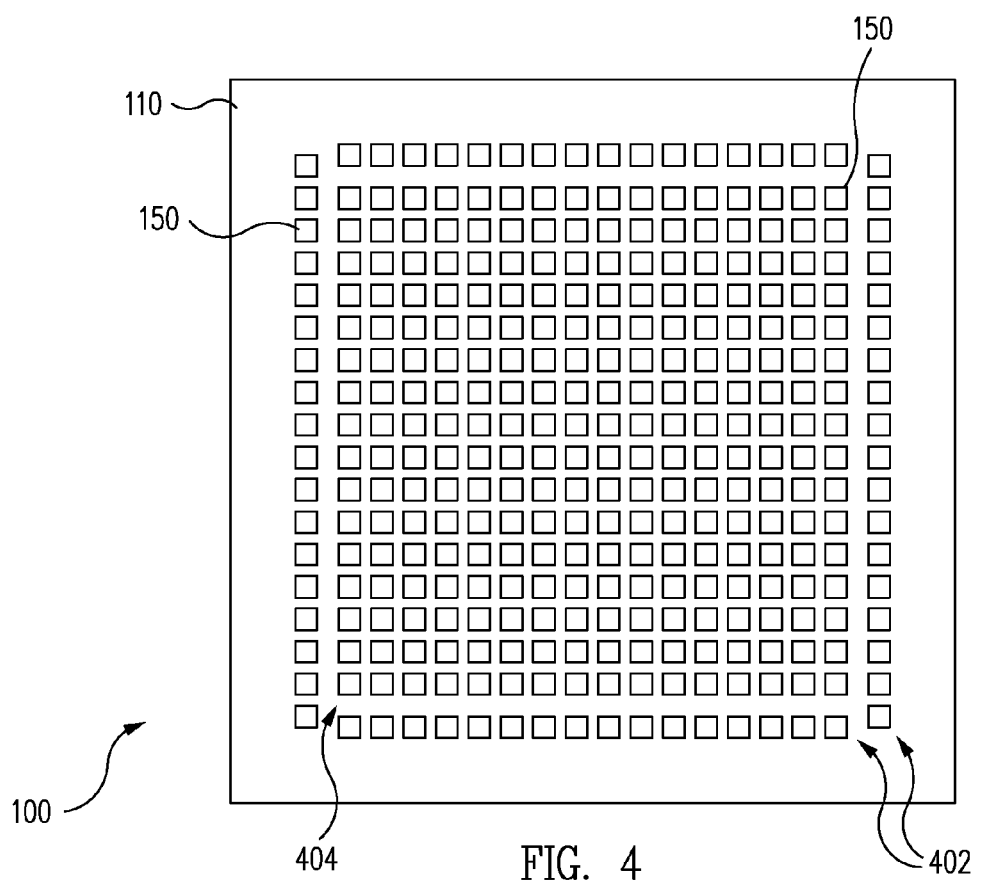
FIG. 4 shows a top-view diagram illustrating the semiconductor device formed from processing operations of FIGS. 1a-1d in accordance with an embodiment of the present invention.
Figure 5:
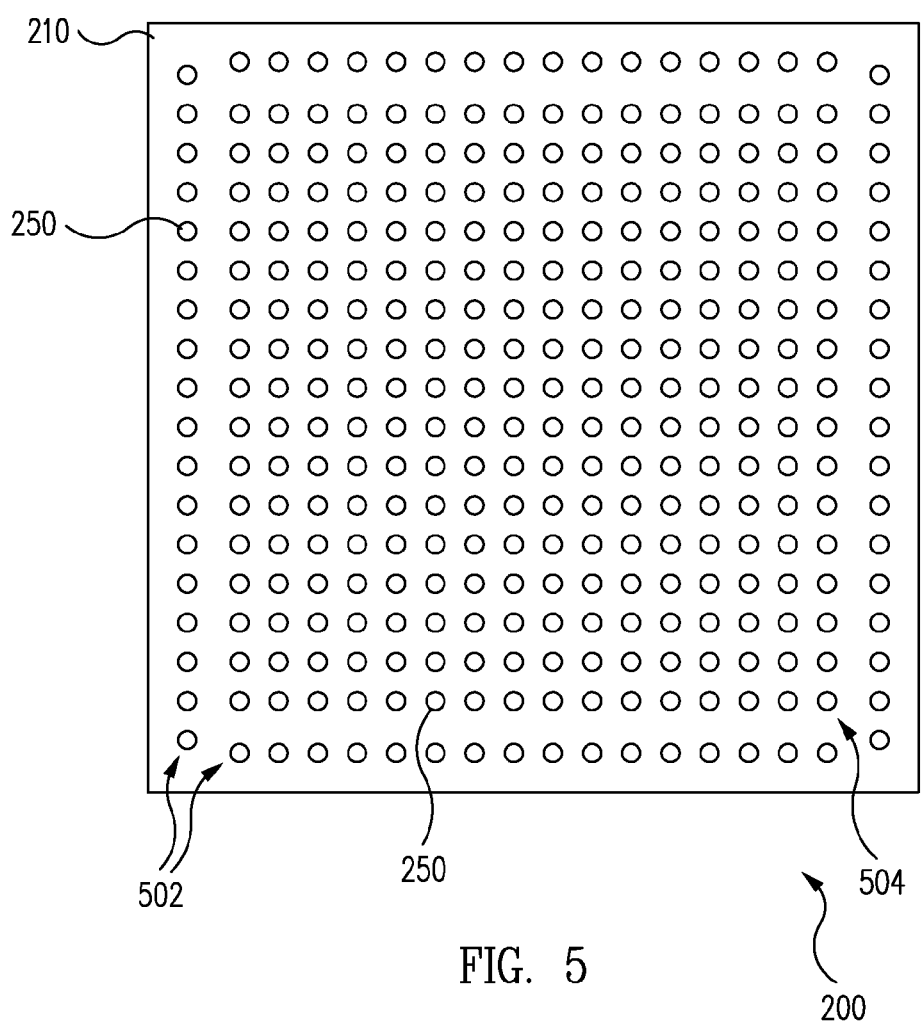
FIG. 5 shows a top-view diagram illustrating the semiconductor device formed from processing operations of FIGS. 2a-2e in accordance with an embodiment of the present invention.

FIG. 4 shows a top-view diagram illustrating semiconductor device 100 formed from processing operations of FIGS. 1a-1d in accordance with an embodiment of the present invention, while FIG. 5 shows a top-view diagram illustrating semiconductor device 200 formed from processing operations of FIGS. 2a-2e in accordance with an embodiment of the present invention. Semiconductor devices 100 and 200 are each typically formed as one of many from larger corresponding wafers, which are then cut from the wafers. Semiconductors 100 and 200 may include a main array 404 and 504 of contacts 150 and 250, respectively, and optionally one or more periphery sets 402 and 502 of contacts 150 and 250, respectively.

Main arrays 404 and 504 typically are joined, as discussed herein, to provide electrical connections for example to support readout of the IR detector and related control and signal operations. Periphery sets 402 and 502 may be provided, for example, to provide common power supply rail paths or other types of signal paths or shared connections to support the functions of semiconductor devices 100 and 200.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method of forming interconnects between semiconductor devices, the method comprising:

depositing a plurality of first contacts on a plurality of corresponding first pads of a first semiconductor device, wherein the depositing comprises:

coating the first semiconductor device with a photoresist that is patterned to expose the first pads prior to the depositing of the plurality of first contacts, wherein the first contacts have approximately a same width and size as the first pads; and removing the photoresist to leave the first contacts on the first pads from the depositing, wherein each of the first contacts provide a substantially flat surface across the width of the first contact as a first contact surface area;

forming a plurality of plated contacts on a plurality of corresponding second pads of a second semiconductor device, wherein each of the plated contacts have a second contact surface area that is less than the first contact surface area;

aligning the plurality of first contacts with the plurality of plated contacts; and joining the plurality of first contacts to the plurality of plated contacts, wherein the plated contacts are harder than the first contacts to initially penetrate the substantially flat surface of the first contacts during the joining, to form the interconnects between the first semiconductor device and the second semiconductor device.

2. The method of claim 1, further comprising applying an adhesive material to interstices between the interconnects.

3. The method of claim 1, wherein the first contacts and the plated contacts comprise an indium material.

4. The method of claim 1, wherein the first semiconductor device comprises a readout integrated circuit, the second semiconductor device comprises an infrared detector, and the joining forms an infrared sensor device comprised of the first and second semiconductor devices.

5. The method of claim 1, wherein the first and second pads comprise at least one of an adhesion layer, a barrier layer, and/or an oxide layer.

6. The method of claim 1, wherein the joining comprises a cold weld and wherein each of the plated contacts is approximately six to ten micrometers in height.

7. The method of claim 1, wherein the forming further comprises:

coating the second semiconductor device with a photoresist;

patterning the photoresist to form exposed regions over the second pads;

performing a plating process; and removing the photoresist to leave the plated contacts on the second pads.

8. The method of claim 1, wherein the first contacts and the plated contacts comprise an indium material, with the plated contacts forming tapered pillars.

9. An infrared sensor device formed at least in part by the method of claim 1.

10. A semiconductor device formed at least in part by the method of claim 1, wherein:

the first semiconductor device comprises a first substrate having the plurality of first contacts on the corresponding first pads;

the second semiconductor device comprises a second substrate having the plurality of plated contacts on the corresponding second pads, wherein the plated contacts provide corresponding second contacts each having the second contact surface area and formed as; and wherein the first contacts are in contact with corresponding ones of the second contacts to electrically couple the first substrate to the second substrate of the semiconductor device.

11. The semiconductor device of claim 10, further comprising an adhesive material disposed between the first and second substrates.

12. The semiconductor device of claim 10, wherein the first and second contacts comprise an indium material, the first substrate comprises a readout integrated circuit, the second substrate comprises an infrared detector, and the semiconductor device comprises an infrared sensor device.

13. The semiconductor device of claim 10, wherein the pillar-like projections are tapered and harder than the first contacts formed by deposition.

14. The semiconductor device of claim 10, wherein the first and second pads comprise at least one of an adhesion layer, a barrier layer, and/or an oxide layer.

15. A method of joining a first substrate to a second substrate to form electrical interconnects, the method comprising:
   forming a plurality of first pads on the first substrate of a first semiconductor device;
   forming by deposition a plurality of first contacts on the corresponding plurality of first pads on the first substrate, wherein the first contacts have approximately a same width and size as the first pads, and wherein each of the first contacts provide a substantially flat area across the width of the first contact;
   wherein the forming by deposition comprises:
      coating the first semiconductor device with a photoresist that is patterned to expose the first pads prior to depositing the plurality of first contacts such that the first contacts have approximately the same width and size as the first pads; and
      removing the photoresist to leave the first contacts on the first pads from the depositing, wherein each of the first contacts provide a substantially flat surface across the width of the first contact as a first contact surface area;
   forming a plurality of second pads on the second substrate of a second semiconductor device;
   forming by plating a plurality of plated contacts on corresponding ones of the plurality of second pads on the second substrate, wherein each of the plated contacts is a second contact providing a pillar-like projection having a second contact surface area that is less than the first contact surface area;
   aligning the substantially flat areas of the plurality of first contacts with corresponding ones of the second contact surface areas of the plurality of second contacts; and
   joining the plurality of first contacts to the plurality of plated contacts, wherein the plated contacts are harder than the first contacts to initially penetrate the substantially flat surface of the first contacts during the joining, to form the electrical interconnects between the first and second substrates through the first and second contacts.

16. The method of claim 15, wherein the first and second contacts comprise an indium material, and wherein the joining further comprises pressing the contact surface areas of the second contacts against corresponding ones of the substantially flat areas of the first contacts.

17. The method of claim 15, further comprising applying an adhesive material between the first and second substrates and within interstices created by the joining to form the electrical interconnects.

18. The method of claim 15, wherein the first substrate comprises a readout integrated circuit, the second substrate comprises an infrared detector, and the joining to form the electrical interconnects forms an infrared sensor device comprised of the first and second substrates.

19. The method of claim 15, further comprising applying an adhesive material between the first and second substrates and within interstices created by the joining to form the electrical interconnects, wherein the first contacts and the plated contacts comprise an indium material, and wherein each of the plated contacts is approximately six to ten micrometers in height.

20. An infrared sensor device formed at least in part by the method of claim 15.

* * * * *